United States Patent
Nataraj et al.

(10) Patent No.: US 6,944,039 B1
(45) Date of Patent: Sep. 13, 2005

(54) CONTENT ADDRESSABLE MEMORY WITH MODE-SELECTABLE MATCH DETECT TIMING

(75) Inventors: Bindiganavale S. Nataraj, Cupertino, CA (US); Sandeep Khanna, Los Altos, CA (US); Varadarajan Srinivasan, Los Altos Hills, CA (US)

(73) Assignee: NetLogic Microsystems, Inc., Mountain View, CA (US)

( * ) Notice: Subject to any disclaimer, the term of this patent is extended or adjusted under 35 U.S.C. 154(b) by 54 days.

(21) Appl. No.: 10/734,464

(22) Filed: Dec. 12, 2003

(51) Int. Cl.[7] ............................................. G11C 15/00
(52) U.S. Cl. ........................... 365/49; 365/233; 711/108
(58) Field of Search .......................... 365/49, 233, 194; 711/108

(56) References Cited

U.S. PATENT DOCUMENTS

| | | |
|---|---|---|
| 6,195,277 B1 | 2/2001 | Sywyk et al. |
| 6,199,140 B1 | 3/2001 | Srinivasan et al. |
| 6,230,236 B1 | 5/2001 | Schultz et al. |
| 6,351,143 B1 | 2/2002 | Guccione et al. |
| 6,661,686 B1 | 12/2003 | Srinivasan |
| 6,785,152 B2 * | 8/2004 | Yiu et al. .................... 365/49 |
| 2002/0093347 A1 | 7/2002 | Henderson et al. |

OTHER PUBLICATIONS

"Self-Timed Hit Circuit for a Content Addressable Memory," IBM Technical Disclosure Bulletin, vol. 38, No. 2, Feb. 1995, pp. 65-66 plus cover and end page.

* cited by examiner

*Primary Examiner*—David Lam
(74) *Attorney, Agent, or Firm*—Shemwell Gregory & Courtney LLP

(57) ABSTRACT

A content addressable memory (CAM) device with mode-selectable match detect timing. The CAM device includes a plurality of rows of CAM cells coupled to respective match lines. Storage circuits are coupled to the match lines and configured to store match indications signaled thereon in response to assertion of a first timing signal. A timing control circuit is coupled to the storage circuits and configured to assert the first timing signal at either a first instant or a second instant according to the state of a mode select signal.

46 Claims, 4 Drawing Sheets

CONTENT ADDRESSABLE MEMORY WITH MODE-SELECTABLE MATCH DETECT TIMING

FIELD OF THE INVENTION

The present invention relates generally to content addressable memory devices, and more particularly to compare operations within content addressable memory devices.

BACKGROUND

Content addressable memory (CAM) devices are often used in network switching and routing applications to determine forwarding destinations for data packets. A CAM device can be instructed to compare a selected portion of an incoming packet, typically a destination field within the packet header, with data values, called CAM words, stored in an associative storage array within the CAM device. If the destination field matches a CAM word, the CAM device generates a match address that identifies the location of the matching CAM word within the storage array, and asserts a match flag to signal the match. The match address is then typically used to address another storage array, either within or separate from the CAM device, to retrieve a destination address or other routing information for the packet.

The associative storage array of a CAM device, commonly referred to as a CAM array, is typically populated with CAM cells arranged in rows and columns. Precharged match lines are coupled to respective rows of the CAM cells, and bit line pairs and compare line pairs are coupled to respective columns of the CAM cells. Together, the bit line pairs form a data port for read/write access to address-selected rows of CAM cells, and the compare line pairs form a compare port for inputting comparand values to the CAM array during compare operations. The CAM cells themselves are specialized store-and-compare circuits each having a storage element to store a constituent bit of a CAM word and a compare circuit for comparing the stored bit with a comparand bit presented on the compare lines. In a typical arrangement, the compare circuits within the CAM cells of a given row are coupled in parallel to the match line for the row, with each compare circuit switchably forming a discharge path to discharge the match line if the stored bit and comparand bit do not match. By this arrangement if any one bit of a CAM word does not match the corresponding bit of the comparand value, the match line for the row is discharged to signal the mismatch condition. If all the bits of the CAM word match the corresponding bits of the comparand value, the match line remains in its precharged state to signal a match. Because a comparand value is presented to all the rows of CAM cells in each compare operation, a rapid, parallel search for a matching CAM word is performed.

FIG. 1 illustrates a row of CAM cells 101 within a prior-art CAM device 100. Each of the CAM cells 101 includes a pair of storage elements 115 and 117 to store data and mask bits (D and M), respectively, and a compare circuit 102 coupled to the storage elements and to a precharged match line, ML (i.e., precharged by precharge circuit, PC). The match line, in turn, is coupled to a match latch circuit 103 that includes a level-converting logic gate 105 and a latch element 107. Referring to FIG. 2, a compare strobe signal, CS, is asserted during a first cycle of a clock signal, CLK, to initiate a compare operation within the CAM device 100. At the following rising edge of the clock signal, a compare enable signal, CE, is asserted to enable a comparand value to be compared with CAM words stored within the CAM device, each bit of the comparand value being driven in complementary form onto a respective pair of compare lines coupled to a column of CAM cells 101. Within a given column of CAM cells, the compare line pair is coupled to gates of transistors 113a and 113b, respectively, of the compare circuits 102 (i.e., within each CAM cell of the column) to enable a comparison between the indicated comparand bit, C, and the data bit, D, stored within storage element 115 of the CAM cell. If the mask bit stored within storage element 117 is reset (i.e., M=0), then transistors 109a and 109b are switched on, enabling the compare circuit 102 to discharge the match line (and thereby signal a mismatch condition) if the data bit and comparand bit do not match. That is, if D=1 and C=0, then the transistor stack formed by transistors 109b, 111b and 113b is switched on to discharge the match line, and if D=0 and C=1, then the transistor stack formed by transistors 109a, 111a and 113a is switched on to discharge the match line. If the mask bit is set (establishing a mask or "don't care" state of the CAM cell), or if the data and comparand bits match, then at least one transistor in each transistor stack will be switched off, isolating the match line from ground within the CAM cell. If the comparand bits and data bits match (or are masked) within all the CAM cells of a row, then the match line will remain in its precharged state to signal the match condition.

Each of the match lines, ML, within the prior art CAM device 100 is discharged and charged according to the RC time constant established by the relatively high-capacitance of the match line and the resistance of the discharge path (i.e., one or more transistor stacks within the compare circuits 102 of a row of CAM cells 101). Referring to FIG. 2, a detect signal, DET, and latch signal, L, are asserted at the rising edge of the clock signal that follows assertion of the compare enable signal to latch the state of the match line, thereby providing one clock cycle for the match lines to be discharged during a compare operation. The detect signal is supplied to a first input of the logic gate 105 to enable the logic gate to output a logic-high or logic-low level match signal according to whether the match line has been discharged below a logic threshold (e.g., midway between logic high and logic low levels). The latch signal is provided to a latch enable input of the latch element 107 and, when asserted, enables the logic level match signal to pass through to the latch element output. When the latch signal is deasserted a short time later, the logic level match signal generated by the logic gate 105 is latched within the latch element 107. At this point, the compare enable signal is deasserted to enable the match lines to be precharged in preparation for a subsequent compare operation.

Still referring to FIGS. 1 and 2, the slowest match line discharge occurs when a single transistor stack discharges the entire match line (i.e., mismatch occurs in a single bit position of a comparand value). In that case, if one or more transistors within the transistor stack do not turn all the way on (e.g., due to a manufacturing defect), the match line is discharged more slowly due to the increased RC time constant and may not be sufficiently discharged by the time the detect and latch signals are asserted, potentially resulting in a false match indication being latched within the latch element 107. Wafer-level testing may identify such slow-discharge failures, with offending CAM rows (i.e., rows of CAM cells) being disabled and replaced by spare (redundant) CAM rows. If there are more defective CAM rows than spare rows, the device may be discarded prior to packaging to avoid the additional effort and cost of product finishing (i.e., packaging, testing, etc . . . ).

One limitation of many test systems is that the relatively high-inductance probes used to inject and measure signals make it difficult to replicate the full-speed operating environment of the CAM device. Referring to FIG. 2, for example, the clock frequency during waver-level testing is usually substantially slower than the clock frequency during normal device operation, resulting in a longer time for match line discharge before assertion of the detect and latch signals. Consequently, as shown in FIG. 3, detect signal assertion during wafer-level testing ($DET_{WT}$) may occur after the match line level drops below a threshold level, resulting in a mismatch detection (i.e., passing the test), while detect signal assertion during normal operation ($DET_{OP}$) occurs before the match line level drops below the threshold level, resulting in an undesired match detection (i.e., capturing a false match indication). Thus, a defective CAM row may go undetected during wafer-level testing resulting in wasted effort and expense to finish an ultimately defective device, the very result sought to be avoided by wafer-level testing. Although newer, higher speed test equipment may be used to detect slow-discharge CAM rows, such testers tend to be considerably more expensive than conventional testers and therefore drive up manufacturing cost.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION

Figure 1:
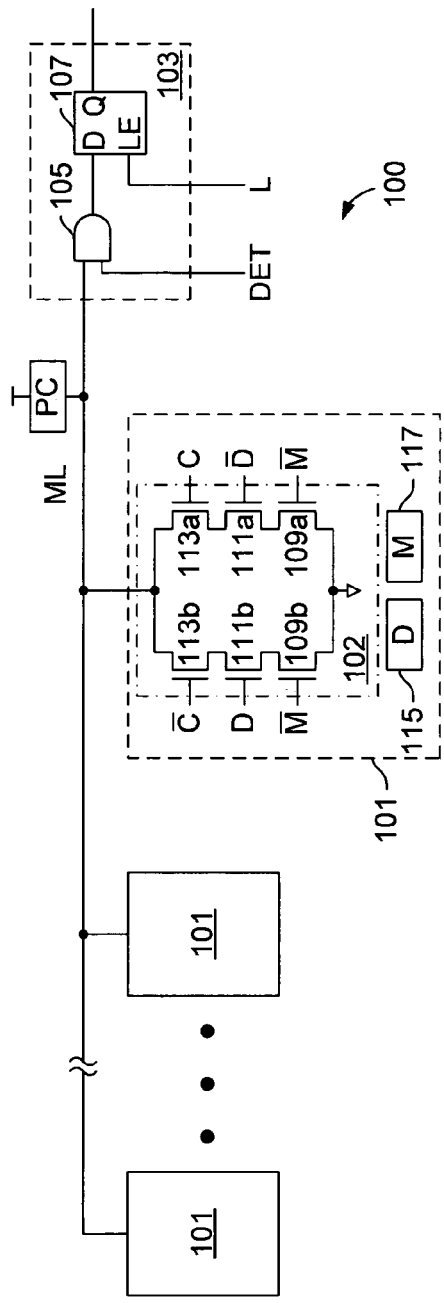
FIG. 1 illustrates a row of CAM cells within a prior-art CAM device 100.
Figure 3:
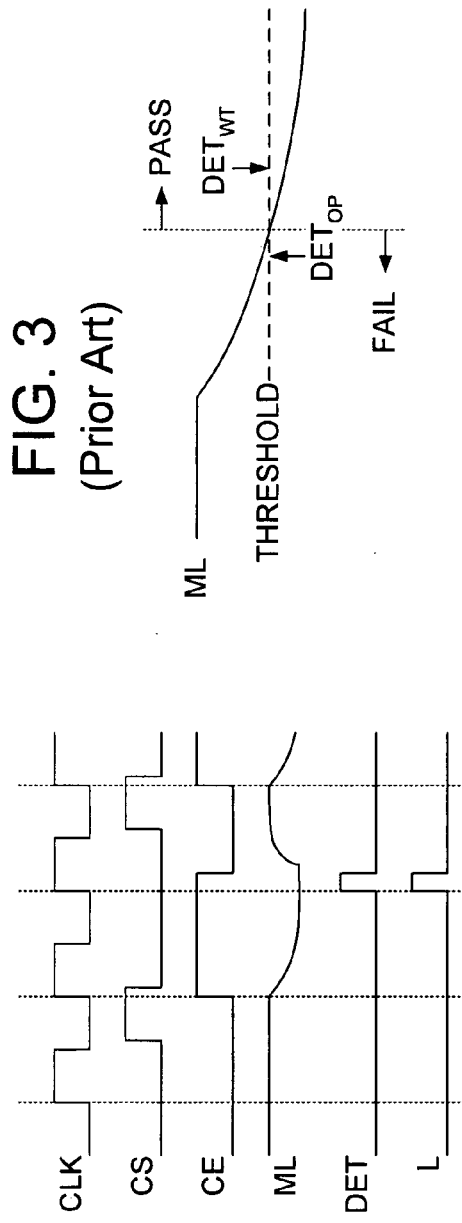
FIG. 3 illustrates the different detect signal assertion times that occur within the prior-art CAM device of FIG. 1 during wafer-level testing and device run-time.
Figure 2:
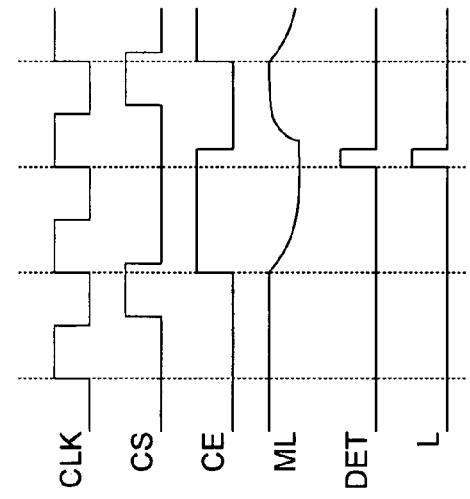
FIG. 2 is a timing diagram illustrating waveforms that occur during a compare operation within the prior-art CAM device of FIG. 1.

In the following description and in the accompanying drawings, specific terminology and drawing symbols are set forth to provide a thorough understanding of the present invention. In some instances, the terminology and symbols may imply specific details that are not required to practice the invention. For example, the interconnection between circuit elements or circuit blocks may be shown or described as multi-conductor or single-conductor signal lines. Each of the multi-conductor signal lines may alternatively be single-conductor signal lines, and each of the single-conductor signal lines may alternatively be multi-conductor signal lines. Signals and signaling paths shown or described as being single-ended may also be differential, and vice-versa. Signals shown or described as having simultaneous rise and/or fall times may be, in fact, offset by a small delay resulting, for example, from manufacturing variations, differences in signal generation circuits or signal paths, propagation delay (e.g., where one of the signals is used to enable generation of the other) and so forth. Similarly, signals described or depicted as having active-high or active-low logic levels may have opposite logic levels in alternative embodiments. As another example, circuits described or depicted as including metal oxide semiconductor (MOS) transistors may alternatively be implemented using bipolar technology or any other technology in which a signal-controlled current flow may be achieved. With respect to terminology, a signal is said to be "asserted" when the signal is driven to a low or high logic state (or charged to a high logic state or discharged to a low logic state) to indicate a particular condition. Conversely, a signal is said to be "deasserted" to indicate that the signal is driven (or charged or discharged) to a state other than the asserted state (including a high or low logic state, or the floating state that may occur when the signal driving circuit is transitioned to a high impedance condition, such as an open drain or open collector condition). A signal driving circuit is said to "output" a signal to a signal receiving circuit when the signal driving circuit asserts (or deasserts, if explicitly stated or indicated by context) the signal on a signal line coupled between the signal driving and signal receiving circuits. A signal line is said to be "activated" when a signal is asserted on the signal line, and "deactivated" when the signal is deasserted. Additionally, the prefix symbol "/" attached to signal names indicates that the signal is an active low signal (i.e., the asserted state is a logic low state). A line over a signal name (e.g., '<signalname>') is also used to indicate an active low signal. The term "terminal" is used to mean a point of electrical connection. The term "exemplary" is used to express but an example, and not a preference or requirement.

In embodiments of the present invention, the duration of a compare operation within a CAM device is controlled in different ways in different operating modes. More specifically, in a normal operating mode, a compare enable signal is asserted in response to a first clock signal transition to start a compare operation, and match timing signals used to detect and store the resulting match indications are asserted in response to a second, later transition of the same clock signal. Thus, the duration of the compare interval, the time prior to match signal assertion during which match lines may be discharged, is dependent on the time between clock signal transitions and therefore upon the frequency of the clock signal. By contrast, in a test mode of at least one embodiment, match timing signals are asserted in response to a delayed instance of the same clock signal transition used to start the compare operation within the CAM array. By this operation, the duration of the test-mode compare interval is established by the delay interval (i.e., the time interval between the un-delayed and delayed instances of the clock signal transition) and therefore independently of the clock signal frequency. By setting the delay interval to correspond to the normal-mode compare interval, the test mode compare interval may be used to approximate the normal-mode compare interval and therefore may be selected during relatively low-speed wafer-level testing to simulate the high-speed, normal mode operation of the CAM device.

Thus, by operating the CAM device in test mode during wafer-level testing, marginally defective CAM rows that might otherwise pass wafer-level tests may be detected, enabling wafer-level repair or rejection of the CAM device and avoiding the effort and expense of finishing a defective device.

Figure 4:
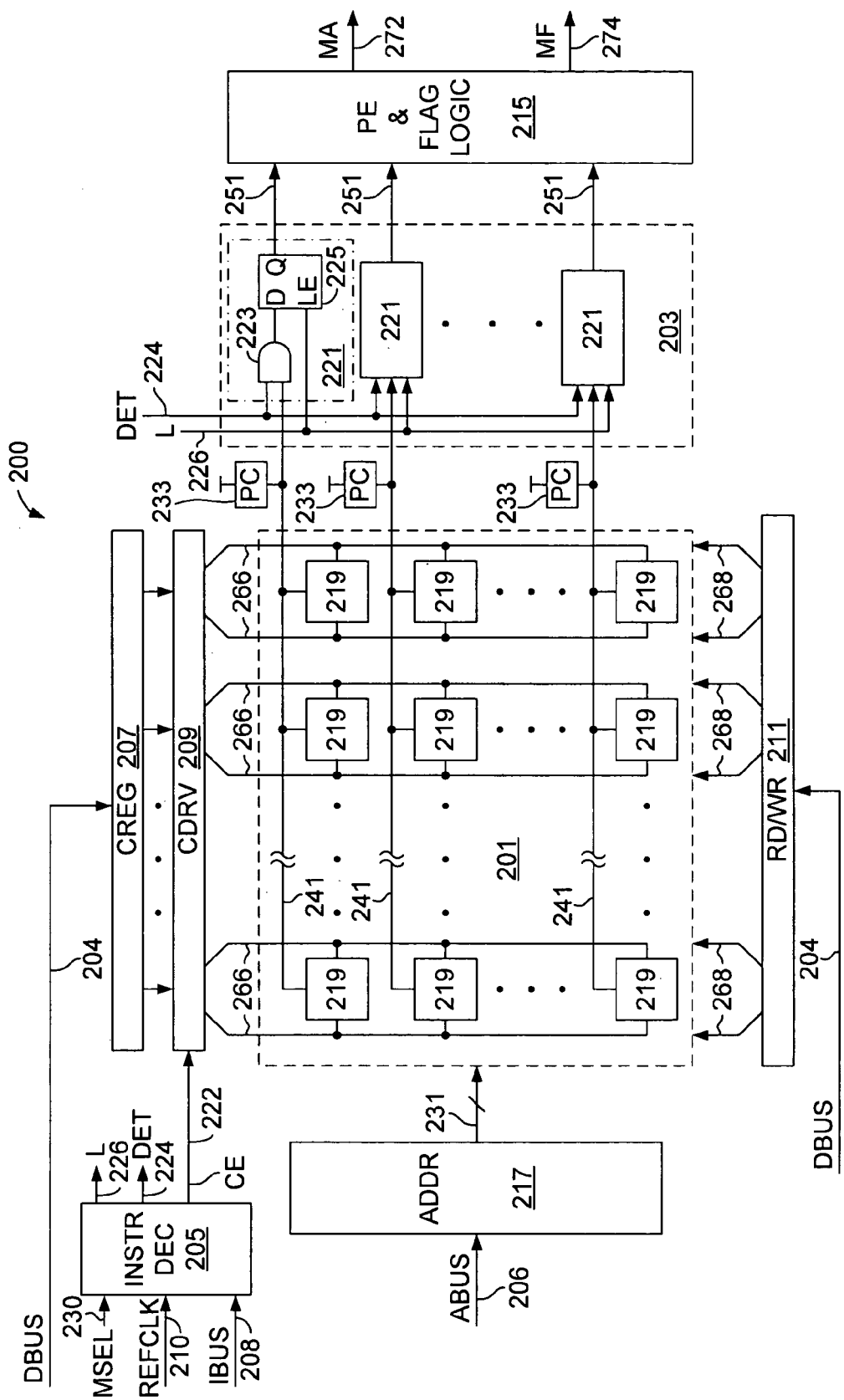
FIG. 4 illustrates a CAM device having circuitry to support normal and test modes of operation according to an embodiment of the invention.

FIG. 4 illustrates a CAM device 200 having circuitry to support normal and test modes of operation according to an embodiment of the invention. The CAM device 200 may be implemented in a dedicated integrated circuit (IC) device or as a portion of an IC device (or IC package) that includes other circuit blocks or features, such as a general purpose or special purpose processor (e.g., network processor or digital signal processor), microcontroller, memory controller, application specific circuitry and so forth. The CAM device 200 includes a CAM array 201, comparand register 207, compare line driver 209, instruction decoder 205, address logic 217, read/write circuit 211, match latch circuit 203 and priority encoder/flag logic circuit 215. Numerous other circuit blocks, not shown, may also be included within the CAM device 200 including, without limitation, input/output circuits, status registers, configuration circuits, associated storage, error detection circuitry and so forth.

The CAM array 201 includes CAM cells 219 arranged in rows and columns with columns of CAM cells coupled to the compare line driver 209 via respective compare line pairs 266, and to the read/write circuit via one or more bit line pairs 268. The rows of CAM cells are coupled to the address logic 217 via respective word lines 231 and to the match latch circuit 203 via respective match lines 241, each match line 241 being precharged between successive compare operations by a respective precharge circuit 233. In one embodiment each of the CAM cells 219 is a ternary CAM cell capable of storing logic '1', logic '0' and "don't care" (i.e., forced-match) states. In other embodiments, the CAM cells 219 may be binary CAM cells capable of storing logic '1' and logic '0' states only, or quaternary CAM cells capable of storing logic '1', logic '0, "don't care" and forced-mismatch states. More generally, the CAM cells 219 may be any type of CAM cell capable of discharging a match line or otherwise signaling a match or mismatch condition.

Instructions such as read, write and compare instructions are issued to the CAM device 200 by a processor, application-specific integrated circuit (ASIC) and/or other host device (not shown) via an instruction bus 208. The instruction decoder 205 responds to instructions received via the instruction bus 208 by issuing control and timing signals to other circuit blocks within the CAM device 200 as necessary to carry out the instructed operation. In the case of read and write instructions, the host device may additionally issue accompanying address values to the CAM device 200 via address bus 206 (i.e., to specify storage locations to be accessed within the CAM array 201) and data words and mask words (referred to collectively herein as CAM words) to be stored within the CAM array via data bus 204. In the case of compare instructions, the host device issues corresponding comparand values to the CAM device via the data bus 204 (or, alternatively, via a separate comparand bus) for comparison with CAM words stored within the CAM array. In alternative embodiments, one or more of the address, instruction and data buses may be eliminated and the corresponding signals time multiplexed onto the remaining bus or buses.

In the embodiment of FIG. 4, the instruction decoder 205 receives a reference clock signal 210 (REFCLK) which is used, together with incoming instructions, to control the generation of control and timing signals supplied to other circuit blocks within the CAM device 200. The reference clock signal 210 may be generated by a clock generating circuit within the CAM device 200 or elsewhere on the integrated circuit in which the CAM device 200 is formed. Alternatively, the reference clock signal 210 may be generated in an external integrated circuit or clock generating element (e.g., a crystal oscillator) in which case the reference clock signal 210 is received via an interconnect structure (e.g., an integrated circuit pin or other contact) and used to generate one or more internal clock signals within the instruction decoder 205 (or elsewhere within the CAM device). The instruction decoder 205 additionally receives a mode select signal 230 (MSEL) which is used to select either a normal operating mode or test operating mode of the CAM device 200. The mode select signal 230 may be a single-bit or multi-bit signal, the latter being used, for example, to enable selection of additional modes of operation within the CAM device 200. Also, the mode select signal 230 may be supplied by an external testing device via a probe-accessible contact point of the CAM device 200, thereby enabling the mode select signal 230 to be driven high or low (or both) during wafer-level testing. Alternatively (or additionally), the state of the mode select signal 230 may be set by programming a mode select value within a configuration circuit of the CAM device 200.

Still referring to FIG. 4, upon decoding (i.e., detecting) a compare instruction, the instruction decoder 205 asserts a control signal (not shown) to enable storage of a corresponding comparand value within the comparand register 207, then asserts a compare enable signal 222 (CE) to enable the comparand driver 209 to output the stored comparand value onto the compare line pairs 266 of the CAM array 201, thus initiating a compare operation. The comparand value is compared simultaneously with the contents of all the rows of CAM cells, with mismatch conditions being signaled by discharged match lines 241 and match conditions being signaled by match lines 241 that remain in the pre-charged state (e.g., logic high). After a mode-dependent compare interval elapses, the instruction decoder 205 asserts match timing signals, detect 224 and latch 226, to enable the match latch circuit 203 to store the states of the match lines 241. In the embodiment of FIG. 4, the match latch circuit 203 includes a plurality of latching circuits 221 each coupled to a respective one of the match lines 241 and outputting a corresponding logic-level match signal 251 to the priority encoder/flag logic circuit 215. Each of the latching circuits 221 includes a level-converting logic gate 223 and a latch element 225. In the embodiment of FIG. 4, the level-converting logic gate 223 is an AND gate (other logic gates may be used) having a first input coupled to receive the detect signal 224, a second input coupled to a corresponding one of the match lines 241, and an output coupled to a data input of the latch element 225. By this arrangement, when the instruction decoder 205 asserts the detect signal 224, the logic gate 223 outputs a logic-level match signal (e.g., having a complementary MOS signal level) in a high or low state according to whether the signal level of the corresponding match line is above or below a threshold. The latch signal 226 is supplied to a latch enable input of the latch element 225 and, when asserted, enables the logic-level match signal generated by the logic gate 223 to pass through the latch element 225. When the latch signal 226 is deasserted, the logic-level match signal is latched (i.e., stored) by the latch element 225 so that a stored, logic-level match signal 251 is provided to the priority encoder/flag logic circuit 215. In alternative embodiments, other types of storage circuits (e.g., edge-triggered storage circuits) may be used to store the logic-level match signal. The priority encoder/flag logic circuit 215 responds to the logic-level match signals from the match latch circuit 203 by generating a match address 272 that corresponds to a highest priority CAM word indicated to match the comparand value, and a match flag 274 that indicates whether any of the CAM words stored within the CAM array 201 match the comparand value. The priority encoder/flag logic circuit 215 may also generate a multiple match flag to indicate whether multiple matches have been detected and other signals relating to compare operations and storage operations within the CAM array (e.g., an almost-full flag to indicate when the CAM array is nearing capacity, a next free address value to indicate a highest-priority unoccupied storage location within the CAM array and so forth).

When the mode select signal 230 is in a first state (e.g., logic low), a normal mode of operation is selected within the CAM device 200. In the normal mode, the instruction decoder 205 asserts the compare enable signal 222 in response to a transition of the reference clock signal 210 (or a clock signal derived from the reference clock signal), and asserts the detect and latch signals 224 and 226 in response to a subsequent transition of the reference clock signal 210 (or derived clock signal). Thus, the duration of the compare interval within the CAM device 200 is dependent upon the time between reference clock signal transitions and therefore upon the frequency of the reference clock signal 210. When the mode select signal 230 is in a second state (e.g., logic high), a test mode of operation is selected within the CAM device 200. In the test mode, the instruction decoder 205 asserts the compare enable signal 222 in response to a transition of the reference clock signal (or a clock signal derived from the reference clock signal), and asserts the detect and latch signals 224 and 226 in response to a delayed instance of the same reference clock signal transition. In one embodiment, an asynchronous delay circuit is used to generate a delayed instance of the reference clock signal (or derived clock signal) so that the assertion time of the detect and latch signals 224 and 226 is independent of the reference clock frequency. By configuring the delay circuit to effect a delay interval having nominally the same duration as the normal-mode compare interval, the test mode may be selected during wafer-level testing (or at other times) to simulate the normal-mode match signal timing.

Figure 5:
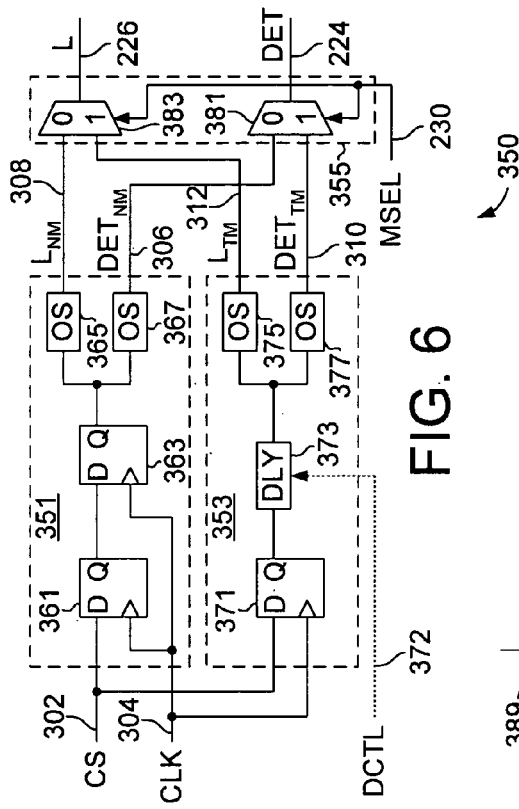
FIG. 5 illustrates an embodiment of a match timing circuit that may be provided within the instruction decoder of FIG. 4 to generate the latch and detect signals and during normal and test modes of operation.

FIG. 5 illustrates an embodiment of a match timing circuit 300 that may be provided within the instruction decoder 205 of FIG. 4 (or other control circuit block) to generate the latch and detect signals 224 and 226 during normal and test modes of operation. The match timing circuit 300 includes a normal-mode timing generator 301, test-mode timing generator 303, and select circuit 305. The normal-mode and test-mode timing generators 301 and 303 are each coupled to receive a compare strobe signal 302 (CS) and clock signal 304 (CLK). The clock signal 304 may be the reference clock signal 210 of FIG. 4 or a clock signal derived from the reference clock signal (e.g., generated by a clock buffer, phase-locked-loop circuit, delay-locked-loop circuit or other clock generating or clock recovery circuit). In one embodiment, the compare strobe signal 302 is generated within the instruction decoder in response to decoding a compare instruction and enables generation of other timing and control signals used to carry out compare operations within the CAM device, including the compare enable signal 222 used to enable the comparand driver of FIG. 4 to output a comparand value onto the compare lines of the CAM array. The normal-mode timing generator 301 generates a normal-mode detect signal 306 ($DET_{NM}$) and a normal mode latch signal 308 ($L_{NM}$) which are supplied to a first input port of the select circuit 305. The test-mode timing generator 303 generates a test-mode detect signal 310 ($DET_{TM}$) and a test-mode latch signal 312 ($L_{TM}$) which are supplied to a second input port of the select circuit 305. The mode select signal 230 is supplied to a control input of the select circuit 305 so that, depending on whether the test mode or normal mode of operation is selected, the select circuit 305 outputs either the normal-mode detect and latch signals, 306 and 308, or the test-mode detect and latch signals, 310 and 312, as the detect and latch signals 224 and 226 supplied to the match latch circuit 203 of FIG. 4.

Figure 6:
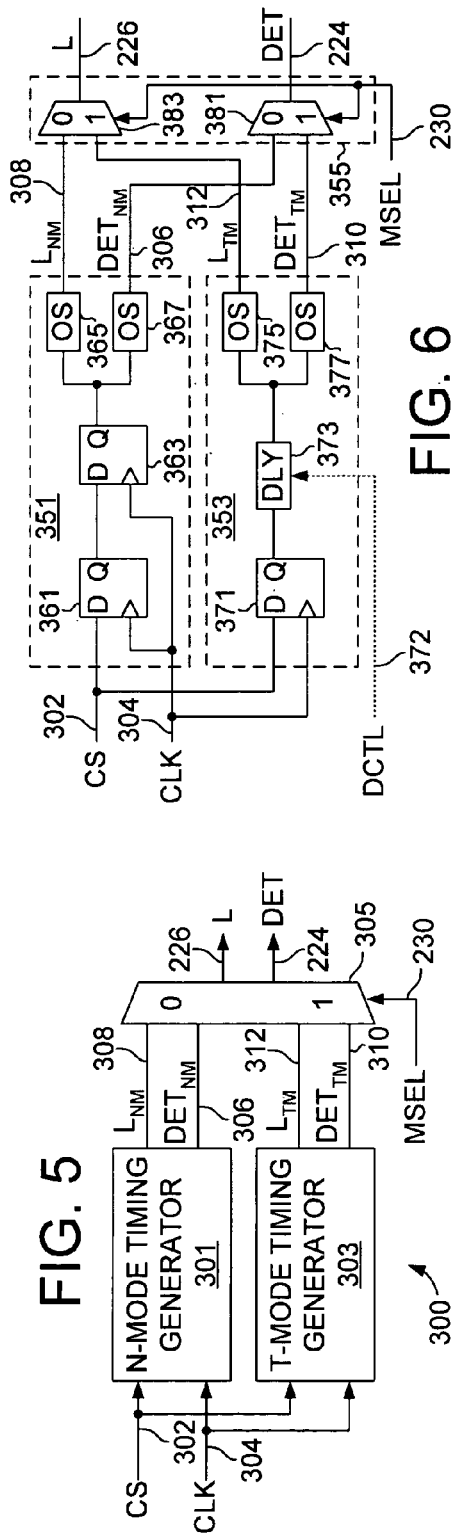
FIG. 6 illustrates a more detailed embodiment of a match timing circuit.

FIG. 6 illustrates a more detailed embodiment of a match timing circuit 350. The match timing circuit 350 includes a normal-mode timing generator 351, test-mode timing generator 353 and select circuit 355 that correspond to the normal-mode timing generator 301, test-mode timing generator 303 and select circuit 305 of FIG. 5. The normal-mode timing generator 351 includes a pair of edge-triggered storage elements 361 and 363 (e.g., D flip-flops) and a pair of one-shot circuits 365 and 367. The data input of storage element 361 is coupled to receive the compare strobe signal 302, and the data output of the storage element 361 is coupled to the data input of storage element 363. The data output of storage element 363 is coupled to inputs of one-shot circuits 365 and 367 which, in turn, output the normal-mode detect and latch signals 306 and 308 to the select circuit 355. The clock signal 304 is provided to strobe inputs of the storage elements 361 and 363 to trigger data load operations.

The test-mode timing generator 353 includes an edge-triggered storage element 371, delay circuit 373 and one-shot circuits 375 and 377. Data and strobe inputs of storage element 371 are coupled to receive the compare strobe signal 302 and clock signal 304, respectively, and a data output of the storage element 371 is coupled an input of the delay circuit 373. The delay circuit output is coupled, in turn, to one-shot circuits 375 and 377.

Figure 7:
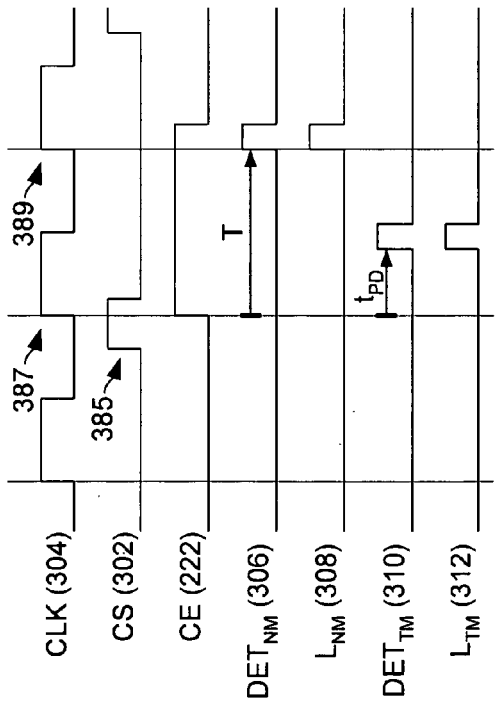
FIG. 7 is a timing diagram illustrating an exemplary operation of the normal-mode and test-mode timing generators of FIG. 6.

FIG. 7 is a timing diagram illustrating an exemplary operation of the normal-mode and test-mode timing generators of FIG. 6. Upon receiving a compare instruction, the instruction decoder (e.g., element 205 of FIG. 4) asserts the compare strobe signal (CS) as shown at 385 and, at the immediately following clock signal edge 387, enables assertion of the compare enable signal 222 (CE). The outputs of storage elements 361 and 371 also go high in response to the rising edge 387 of the clock signal 304. In the normal-mode timing generator, the output of the storage element 363 goes high one clock cycle later (at clock edge 389) and triggers the assertion of the normal-mode detect and latch signals 306 and 308 (pulses) within the one-shot circuits 365 and 367. Thus, in the embodiment of FIG. 6, the normal-mode compare interval is defined by the interval, T, between successive rising edges of the clock signal 304 and therefore is dependent on the clock signal frequency. In the test-mode timing generator, by contrast, the high-going output of storage element 371 propagates through the delay circuit 373 during a propagation interval, $t_{PD}$, then triggers the generation of the test-mode detect and latch signals 310 and 312 within one-shot circuits 375 and 377. Thus, the propagation interval of the delay circuit 373 determines the test-mode compare interval and not the frequency of the clock signal 304. Accordingly, by setting the delay interval of the delay circuit 373 such that the propagation interval is substantially similar to the run-time period of the clock signal 304, the test-mode latch and detect signals 310 and 312 may be used during low-frequency wafer testing (i.e., when T is substantially longer) to approximate the full-speed, normal-mode generation of the latch and detect signals.

In the embodiment of FIG. 6, a delay control signal 372 (DCTL) is provided to select input of the delay circuit 373 to select one of a plurality of different delay intervals, thus allowing the propagation interval of the delay circuit 373 (and therefore the test-mode compare interval) to be adjusted as necessary to accommodate device testing goals (e.g., allowing selection of more stringent or relaxed testing parameters) and to enable simulation of different frequencies of operation (e.g., enabling devices to be binned according to test results). In an alternative embodiment, the delay control signal may be omitted and the delay interval of the delay circuit fixed at design or production time (e.g., by blowing fuses or other one-time configuration operation).

Still referring to FIG. 6, the select circuit 355 includes a detect signal multiplexer 381 having first and second input ports coupled to receive the normal-mode and test-mode detect signals 306 and 310, respectively, and a latch signal multiplexer 383 having first and second input ports coupled to receive the normal-mode and test-mode latch signals 308 and 312, respectively. By this arrangement, when the mode select signal 230 is in a first state (e.g., a logic low state), the normal-mode detect and latch signals, 306 and 308, are output by the detect and latch multiplexers, 381 and 383, respectively, and when the mode select signal 230 is in a second state, the test-mode detect and latch signals, 310 and 312, are output by the detect and latch multiplexers, 381 and 383.

In the embodiment of FIG. 6, separate one-shot circuits are provided within the normal-mode timing generator 351 and within the test-mode timing generator 353 (i.e., circuits 365 and 367, and 375 and 377) to generate detect and latch signals 224 and 226 having different pulse durations (e.g., to satisfy setup and hold time requirements within the latch element 225 of FIG. 4). In an alternative embodiment, the detect and latch signals 224 and 226 may have identical pulse durations so that one of the one-shot circuits within each of the timing generators 351 and 353 may be omitted and the remaining one-shot circuit used to generate both the detect signal 224 and latch signal 226. In yet other embodiments, the pulse duration of the detect and latch signals 224 and 226 may be programmable. For example, pulse duration values may be stored within a configuration circuit and provided to the one-shot circuits within each (or either) of the timing generators 351 and 353 to establish the pulse durations of the detect and latch signals 224 and 226. In other embodiments, the one-shot circuits 365, 367, 375 and/or 377 may be replaced by edge or level-triggered storage elements.

Figure 8:
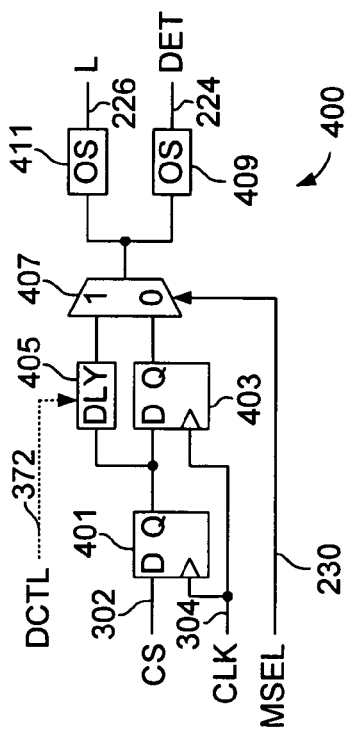
FIG. 8 illustrates a match timing circuit according to an alternative embodiment.

FIG. 8 illustrates a match timing circuit 400 according to an alternative embodiment. The match timing circuit 400 includes a pair of edge-triggered storage elements 401 and 403, delay circuit 405, select circuit 407 and one-shot circuits 409 and 411. The storage elements 401 and 403 are coupled to one another and coupled to receive the compare strobe signal 302 (i.e., at the data input of element 401) and clock signal 304 in the same manner as storage elements 361 and 363 of FIG. 6. The output of storage element 401 is additionally coupled to the delay circuit 405. By this arrangement, the storage circuit 401 effectively serves the purpose of storage elements 361 and 371 in the embodiment of FIG. 6. The delay circuit 405 exhibits a propagation time, $t_{PD}$, and therefore generates a delayed version of the rising edge signal output by storage element 401. The output of the delay element 405 thus corresponds to the output of the delay element 373 of FIG. 6 and the output of the storage element 403 corresponds to the output of the storage circuit 363 of FIG. 6. The outputs of the storage circuit 403 and delay element 405 are supplied to first and second input ports, respectively, of the select circuit 407 (e.g., a multiplexer) which, in turn, passes a selected one of the storage circuit and delay element outputs to the inputs of one-shot circuits 409 and 411 according to the state of the mode select signal 230. By this arrangement, when the mode select signal 230 indicates a normal mode of operation, the output of the storage element 403 is selected to drive the one-shot circuits 409 and 411 so that the resulting detect and latch signals 224 and 226 are asserted at the clock-frequency times shown in FIG. 7 (i.e., one cycle of the clock signal 303 after assertion of the compare enable signal 302). When the mode select signal indicates a test mode, the output of the delay circuit 405 is selected to drive the one-shot circuits 409 and 411 so that the resulting detect and latch signals 224 and 226 are asserted at the clock-frequency-independent times shown in FIG. 7 (i.e., a delay interval, $t_{PD}$, after assertion of the compare enable signal).

Figure 9:
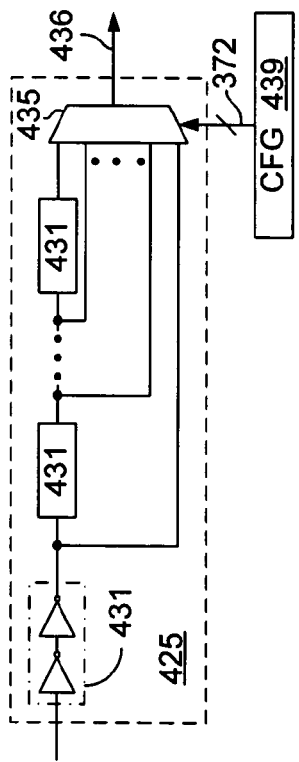
FIG. 9 illustrates a delay circuit that may be used to implement the delay circuits of FIGS. 6 and 8.
Figure 10:
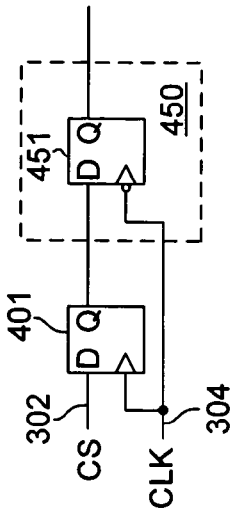
FIG. 10 illustrates a delay circuit according to an alternative embodiment.

FIG. 9 illustrates a delay circuit 425 that may be used to implement the delay circuits 373 and 405 of FIGS. 6 and 8. The delay circuit 425 includes a number of delay elements, $431_1$–$431_N$, coupled in series to form a delay line. The delay elements 431 may be implemented by a series-coupled set of inverters as shown in the detail view of delay element $431_1$ or any other passive or active circuit element suitable for introducing a propagation delay. Each delay element 431 introduces an incremental propagation delay, $t_D$, in a signal propagating through the delay line such that a set of progressively more delayed instances of the input signal are generated at respective outputs of the delay elements 431. The output of each delay element 431 constitutes a tap in the overall delay line and is coupled to a respective input of a select circuit 435. By this arrangement, the select circuit 435 receives a set of N delayed signals that correspond to delay intervals $t_D$, $2t_D$, $3t_D$, . . . , $Nt_D$. A delay control signal 372 is provided from a configuration circuit 439 to a control input of the select circuit 435 to select one of the delayed signals to be output as a selected delayed signal 436, thereby establishing the delay interval of the delay circuit 425. The delay control value 372 may be stored within the configuration circuit 439 during device production time (e.g., by blowing fused elements or other configuration operation), and/or during a run-time programming operation (e.g., storing a host-specified delay control value in a volatile or non-volatile storage of the configuration circuit in response to a host instruction). In alternative embodiments, the delay circuit 425 may exhibit a fixed, rather than selectable delay interval. Also, in a selectable delay interval embodiment, the first delay element in the delay line, $431_1$, may introduce a coarse delay, X, such that the set of N delayed signals correspond to delay intervals of X, $X+t_D$, $X+2t_D$, . . . $X+(N-1)t_D$, with the coarse delay, X, being designed or programmed to center the range of delay intervals about a desired delay interval. Also, the individual the data elements $431_1$–$431_N$ need not introduce equal delays. Further, while the delay circuit 425 is an asynchronous (i.e., un-clocked) delay circuit, synchronous delay circuits that introduce delays based on fractions of a clock cycle may be used in alternative embodiments. Referring to FIG. 10, for example, a storage element 451 having an inverting strobe input (and therefore triggered by a falling edge of the clock signal 304) may be used to implement a synchronous delay circuit 450 having a half clock cycle propagation delay (storage element 401 of FIG. 8, clock signal 304 and compare strobe signal 302 are shown for context). Such an embodiment may be used in wafer level testing carried out at one-half the normal operating frequency (i.e., run-time operating frequency), as a half-period of a clock signal oscillating at 50% of the run-time frequency matches a full period of the clock signal oscillating at the full run-time frequency. More generally, any delay circuit exhibiting a fixed or adjustable delay interval may be used to implement the delay circuits 373 and 405 of FIGS. 6 and 8 without departing from the scope of the invention.

Referring again to FIG. 6, in an alternative embodiment, the normal-mode timing generator 351 may be replaced by a timing generator identical (or substantially identical) to the test-mode timing generator 353, but having a delay circuit 373 with a different delay interval. As with the test-mode timing generator 353, the delay circuit within the normal-mode timing generator may have a fixed delay interval or may receive a delay control signal to enable selection of one of a number of different delay intervals. In another embodiment, the normal-mode timing generator 351 and select circuit 355 may be omitted altogether from the embodiment of FIG. 6, and the test-mode timing generator 353 set to different delay intervals according to the state of the mode select signal, thus effecting different compare intervals in different operating modes.

Although the invention has been described with reference to specific embodiments thereof, it will be evident that various modifications and changes may be made thereto without departing from the broader spirit and scope of the invention. The specification and drawings are, accordingly, to be regarded in an illustrative rather than restrictive sense.

What is claimed is:

1. A content addressable memory (CAM) device comprising:
    a plurality of CAM cells;
    match lines coupled to respective rows of the CAM cells;
    storage circuits coupled to the match lines and configured to store, in response to assertion of a first timing signal, match indications signaled on the match lines; and
    a timing control circuit coupled to the storage circuits and configured to assert the first timing signal at either a first instant or a second instant according to the state of a mode select signal.

2. The CAM device of claim 1 wherein the timing control circuit receives a clock signal and a first compare signal, and wherein the second instant occurs at least one cycle of the clock signal after the first compare signal is asserted.

3. The CAM device of claim 2 wherein the first instant occurs prior to the second instant and after the compare signal is asserted.

4. The CAM device of claim 2 wherein the second instant is substantially coincident with a selected transition of the clock signal that occurs at least one cycle of the clock signal after the first compare signal is asserted.

5. The CAM device of claim 4 wherein the selected transition of the clock signal follows a first transition of the clock signal, the first transition of the clock signal occurring after the first compare signal is asserted.

6. The CAM device of claim 5 wherein the first transition of the clock signal and the selected transition of the clock signal are both rising edge transitions of the clock signal.

7. The CAM device of claim 5 wherein the first instant occurs after the first transition of the clock signal and prior to the selected transition of the clock signal.

8. The CAM device of claim 7 wherein the timing control circuit comprises a delay circuit to enable assertion of the first timing signal after a delay interval following the first transition of the clock signal, the length of the delay interval determining the first instant.

9. The CAM device of claim 8 wherein the delay circuit includes a select input to receive a delay control value, the delay circuit being responsive to the delay control value to select one of a plurality of different time intervals to be the delay interval.

10. The CAM device of claim 9 further comprising a configuration circuit to store a value indicative of the delay control value.

11. The CAM device of claim 10 wherein the configuration circuit comprises a run-time programmable configuration register.

12. The CAM device of claim 10 wherein the configuration circuit comprises a storage location to store a value that controls the state of the mode select signal.

13. The CAM device of claim 1 further comprising an integrated circuit contact to receive a signal that controls the state of the mode select signal.

14. The CAM device of claim 1 wherein the second instant coincides with an edge of a clock signal.

15. The CAM device of claim 1 wherein the timing control circuit comprises a delay circuit to enable assertion of the first timing signal after a delay interval, the length of the delay interval determining the first instant.

16. The CAM device of claim 15 wherein the delay circuit comprises a select circuit to select one of a plurality of different time intervals to be the delay interval according to the state of a delay control value.

17. The CAM device of claim 15 further comprising a one-shot circuit coupled to an output of the delay circuit and configured to assert the timing control signal for a period of time after the delay interval.

18. The CAM device of claim 1 wherein the timing control circuit comprises:
    a first timing circuit to assert a first intermediate timing signal at the first instant;
    a second timing circuit to assert a second intermediate timing signal at the second instant; and
    a select circuit to select, in response to the mode select signal, either the first intermediate timing signal or the second intermediate timing signal to be the first timing signal.

19. The CAM device of claim 18 wherein the second timing circuit is configured to assert the second intermediate timing signal at a time substantially coincident with a selected transition of a clock signal.

20. The CAM device of claim 19 wherein the first timing circuit is configured to assert the first intermediate timing signal a delay time after a first transition of the clock signal, the first transition of the clock signal preceding the selected transition of the clock signal, and the delay time being less than the time interval between the first transition of the clock signal and the selected transition of the clock signal.

21. A content addressable memory (CAM) device comprising:
    a CAM array to generate a plurality of match indications;
    a configuration circuit to store a delay control value;
    a timing control circuit coupled to receive the delay control value from the configuration circuit and configured to generate a timing control signal a delay time after assertion of a first control signal, the delay time being selected from one of a plurality of different time intervals according to the delay control value; and a storage circuit coupled to receive the match indications from the CAM array and configured to store match indications in response to the timing control signal.

22. The CAM device of claim 21 wherein the configuration circuit is a run-time programmable storage register.

23. The CAM device of claim 22 wherein the configuration circuit comprises fused elements that are blown in a programming operation to store the delay control value.

24. A method of operation within a content addressable memory (CAM) device comprising:
generating a plurality of match indications in response to assertion of a compare signal; and
storing the plurality of match indications at either a first time or a second time according to the state of a mode select signal.

25. The method of claim 24 wherein generating a plurality of match indications in response to assertion of a compare signal comprises asserting a compare enable signal in response to a transition of a clock signal that occurs after assertion of the compare signal, the compare enable signal enabling a comparand value to be output to an array of CAM cells within the CAM device for comparison with contents thereof.

26. The method of claim 24 wherein storing the plurality of match indications at the second time comprises storing the plurality of match indications substantially coincidentally with a selected clock signal transition that follows assertion of the compare signal.

27. The method of claim 26 wherein storing the plurality of match indications substantially coincidentally with a selected clock signal transition:
detecting a first transition of the clock signal that follows assertion of the compare signal;
detecting a second transition of the clock signal that follows the first transition of the clock signal; and
storing the plurality of match indications in response to the second transition of the clock signal.

28. The method of claim 27 wherein the first transition of the clock signal and the second transition of the clock signal are both rising edge transitions of the clock signal.

29. The method of claim 27 wherein storing the match indications at the second time comprises storing the plurality of match indications after the first transition of the clock signal and prior to the second transition of the clock signal.

30. The method of claim 24 wherein storing the match indications at the second time comprises delaying for a first time interval after assertion of the compare signal before storing the match indications.

31. The method of claim 30 wherein delaying for a first time interval comprises delaying for a time required for a timing signal to propagate through a delay circuit.

32. The method of claim 31 further comprising outputting a delay control value to the delay circuit to select one of a plurality of different times required for the timing signal propagate through the delay circuit.

33. The method of claim 32 further comprising storing the delay control value within a configuration circuit of the CAM device.

34. The method of claim 33 wherein storing the delay control value within the configuration circuit comprises issuing an instruction to a control circuit of the CAM device, the instruction instructing the control circuit to store the delay control value within the configuration circuit.

35. The method of claim 33 wherein storing the delay control value within a configuration circuit of the CAM device comprises programming the delay control value within the configuration circuit in a one-time programming operation.

36. The method of claim 35 wherein programming the delay control value within the configuration circuit in a one-time programming operation comprises blowing one or more fused elements within the CAM device.

37. The method of claim 24 wherein generating the plurality of match indications comprises generating signal levels on a plurality of match lines of the CAM device, and wherein storing the plurality of match indications at either a first time or a second time comprises asserting a detect signal at either the first time or the second time to enable a plurality of logic circuits to generate logic level outputs according to respective signal levels on the plurality of match lines.

38. The method of claim 37 wherein generating signal levels on a plurality of match lines of the CAM device comprises selectively discharging the match lines of the CAM device according to whether corresponding data words stored within the CAM device match a comparand value.

39. The method of claim 24 wherein storing the plurality of match indications at either a first time or a second time comprises generating a pulse at either the first time or the second time to enable a plurality of storage circuits to store the match indications.

40. The method of claim 24 wherein generating a pulse at either the first time or the second time to enable a plurality of storage circuits to store the match indications comprises asserting and then deasserting a latch enable signal to enable a plurality of latch circuits to store the match indications.

41. The method of claim 24 further comprising generating a match address that corresponds to a selected one of the match indications.

42. The method of claim 24 further comprising setting the mode select signal to a first state, during a wafer test of the CAM device and setting the mode select signal to a second state during normal operation of the CAM device.

43. The method of claim 42 wherein setting the mode select signal to the first state comprises contacting a contact point of the CAM device with a test probe.

44. A content addressable memory (CAM) device comprising:
means for generating a plurality of match indications in response to assertion of a compare signal; and
means for storing the plurality of match indications at either a first time or a second, later time according to the state of a mode select signal.

45. The CAM device of claim 44 wherein the means for storing the match indications at the second time comprises means for storing the plurality of match indications after a first transition of a clock signal and prior to a second transition of the clock signal.

46. The CAM device of claim 45 wherein the means for storing the match indications at the first time comprises means for storing the plurality of match indications in response to the second transition of the clock signal.

* * * * *